United States Patent
Ho et al.

(10) Patent No.: US 9,197,237 B2
(45) Date of Patent: Nov. 24, 2015

(54) LOSS OF SIGNAL DETECTION FOR HIGH-SPEED SERIAL LINKS

(71) Applicant: Lattice Semiconductor Corporation, Hillsboro, OR (US)

(72) Inventors: Vinh Ho, Milpitas, CA (US); Hamid Ghezel, Santa Cruz, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 52 days.

(21) Appl. No.: 13/868,738

(22) Filed: Apr. 23, 2013

(65) Prior Publication Data

US 2014/0105265 A1 Apr. 17, 2014

Related U.S. Application Data

(60) Provisional application No. 61/714,636, filed on Oct. 16, 2012.

(51) Int. Cl.

| | |
|---|---|
| *H03M 1/34* | (2006.01) |
| *H04L 12/801* | (2013.01) |
| *G11C 11/413* | (2006.01) |
| *H04L 25/02* | (2006.01) |
| *H04L 12/24* | (2006.01) |
| *G01R 31/3185* | (2006.01) |
| *H03M 1/00* | (2006.01) |
| *H01L 23/498* | (2006.01) |
| *H01L 23/50* | (2006.01) |

(52) U.S. Cl.
CPC ......... *H03M 1/34* (2013.01); *G01R 31/318597* (2013.01); *G11C 11/413* (2013.01); *H01L 23/49838* (2013.01); *H03M 1/001* (2013.01); *H04L 25/0262* (2013.01); *H04L 41/0806* (2013.01); *H04L 47/10* (2013.01); *H01L 23/49816* (2013.01); *H01L 23/49822* (2013.01); *H01L 23/50* (2013.01); *H01L 2224/16225* (2013.01); *H01L 2224/32225* (2013.01); *H01L 2224/73204* (2013.01); *H01L 2924/13091* (2013.01); *H01L 2924/15311* (2013.01)

(58) Field of Classification Search
CPC ... H04L 47/10; H04L 1/0039; H04L 25/0272; H04L 7/08; H04L 7/10
See application file for complete search history.

(56) References Cited

U.S. PATENT DOCUMENTS

| | | | |
|---|---|---|---|
| 6,519,508 B1 * | 2/2003 | Saito | 700/282 |
| 6,566,944 B1 * | 5/2003 | Pehlke et al. | 330/10 |
| 6,897,712 B2 | 5/2005 | Ficken et al. | |
| 7,102,392 B2 | 9/2006 | Hsu et al. | |
| 7,176,762 B2 | 2/2007 | Johnson | |
| 7,218,903 B2 | 5/2007 | Komatsu et al. | |
| 7,263,151 B2 | 8/2007 | Momtaz et al. | |
| 7,282,965 B2 | 10/2007 | Hatooka et al. | |
| 7,358,776 B2 | 4/2008 | Matsumoto | |
| 7,474,133 B1 * | 1/2009 | Aude et al. | 327/108 |
| 7,576,570 B1 | 8/2009 | Wong et al. | |
| 7,812,591 B1 | 10/2010 | Pan et al. | |
| 8,188,792 B1 * | 5/2012 | Narayan et al. | 330/257 |
| 2001/0020670 A1 * | 9/2001 | Hyoga | 250/205 |
| 2003/0201799 A1 * | 10/2003 | Takauchi et al. | 326/127 |
| 2006/0232524 A1 * | 10/2006 | Cok | 345/82 |
| 2006/0284671 A1 * | 12/2006 | Ohba | 330/9 |
| 2007/0273435 A1 * | 11/2007 | Katsunaga et al. | 327/563 |
| 2009/0284311 A1 * | 11/2009 | Ito | 327/581 |

* cited by examiner

*Primary Examiner* — Leon-Viet Nguyen
*Assistant Examiner* — Sarah Hassan

(57) ABSTRACT

In one embodiment, a loss-of-signal detector is provided that is immune to variations in common mode voltage for a received differential input signal. The loss-of-signal detector is configured is to use a reference voltage that depends upon the common mode voltage.

14 Claims, 5 Drawing Sheets

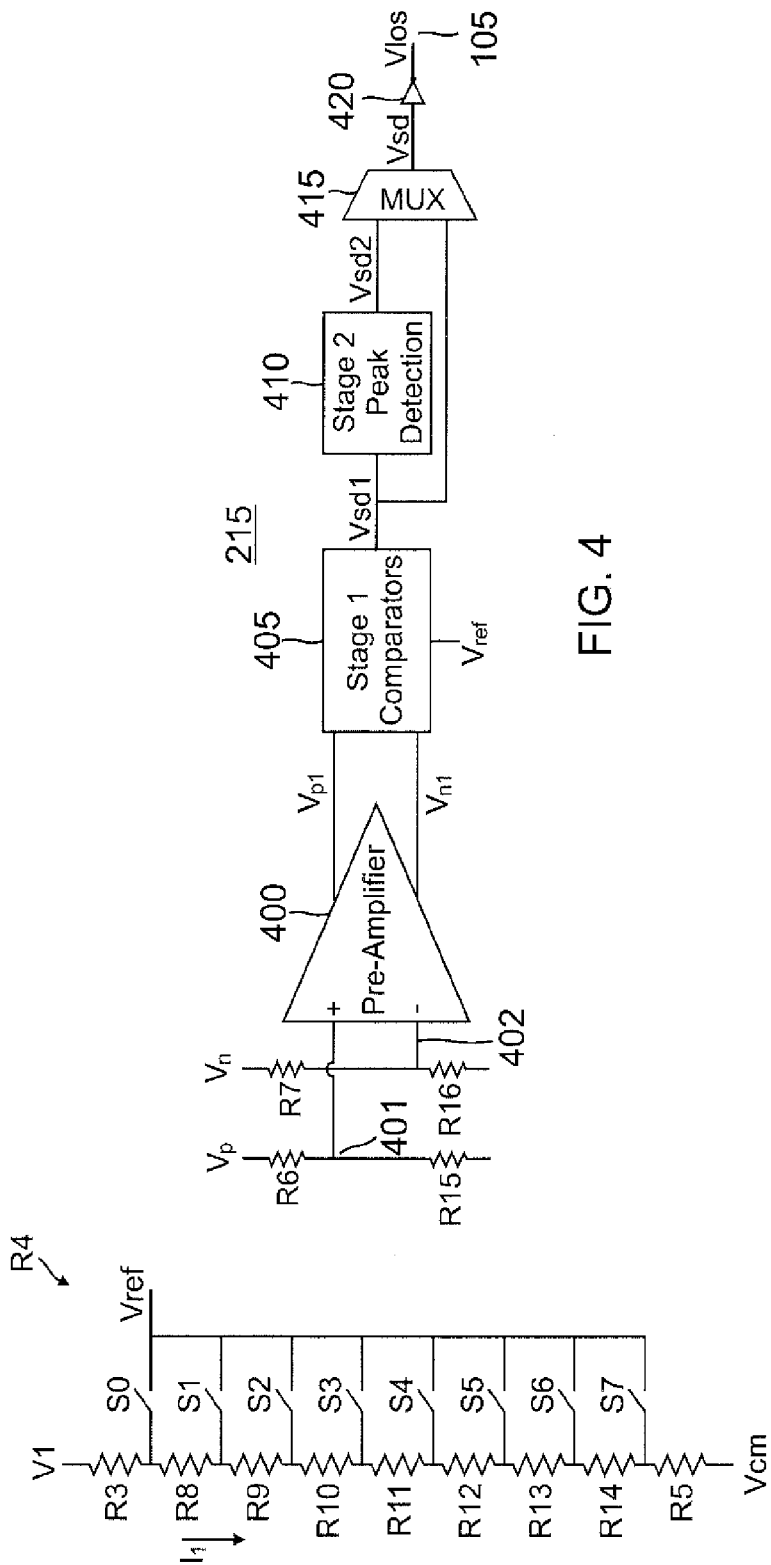

LOSS OF SIGNAL DETECTION FOR HIGH-SPEED SERIAL LINKS

RELATED APPLICATION

This application claims the benefit of U.S. Provisional Application No. 61/714,636, filed Oct. 16, 2012, which is incorporated herein in its entirety.

TECHNICAL FIELD

The present invention relates generally to high-speed serial links, and more particularly, to a circuit to detect signal loss in high-speed serial links.

BACKGROUND

High speed serial links use a serializer/deserializer (SERDES) in the transmitting and receiving integrated circuits. A transmitting SERDES transforms parallel data from a relatively low-speed clock domain into serialized data at a relatively high-speed clock rate. A receiving SERDES deserializes the serialized data back into parallel data. The high-speed clock is embedded with the transmitted serialized data. The receiving SERDES thus includes a clock recovery circuit to recover the embedded high-speed clock. But the clock recovery circuit presumes the existence of a valid received serialized signal. If the received signal has an insufficient signal amplitude such as from a low signal-to-noise ratio (SNR), unacceptable error rates will result. The amplitude of the received serialized signal must be sufficiently large to achieve low bit error rates. A sufficient signal amplitude enables a high signal-to-noise (SNR) ratio upon receipt and also assures open data eyes in the receiver inputs. Thus, it is conventional for high-speed serial links to include a loss-of-signal detector. The SERDES will not deserialize the received signal if the loss-of-signal detector indicates that the received signal is lost or invalid.

But accurate signal detection is a challenging task in high-speed serial links such as used for multi-giga-bit-per-second protocols. In particular, loss-of-signal detection needs to be independent of the transmitted data. In other words, events such as random data, consecutive identical data, or common mode voltage variation should not degrade the loss-of-signal detection quality. In addition, loss-of-signal detection should not degrade the return loss performance of the associated receiver input.

To attempt to satisfy these goals for loss-of-signal detection, traditional high-speed serial links have used a peak detection approach such as used in squelch circuits. A half-wave or full-wave rectifier rectifies the incoming data in one polarity and retains the peak signal amplitude of the rectified input signal using a low-pass filter such as a capacitor. A high-speed comparator compares the peak signal amplitude with a reference voltage to determine whether a loss-of-signal has occurred. The high-speed comparator typically requires hysteresis to avoid unwanted signal detection transitions. These traditional approaches to loss-of-signal detection suffer from data dependency, process and temperature variations, and other deleterious effects. Moreover, device leakage becomes a problem in the smaller process nodes.

An alternative to the peak detection approach involves the use of an analog multiplier cell to rectify the incoming data and add it to a reference voltage. A differential comparator detects a differential rectified output signal from the analog multiplier cell to determine whether a loss-of-signal had occurred. Dependency to the common mode voltage of the input data is a major problem for such an analog multiplier technique. In addition, the multiplier cells have a limited bandwidth and are dependent on the data rate. The signal detection accuracy for analog multiplier cell architectures is thus problematic.

Accordingly, there is a need in the art for improved loss-of-signal detectors for high-speed serial links.

BRIEF DESCRIPTION OF THE DRAWINGS

FIG. 3 is a schematic diagram for a variable resistor in the loss-of-signal detector of FIG. 2.

FIG. 4 is a diagram of the signal detection module within the loss-of-signal detector of FIG. 2.

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
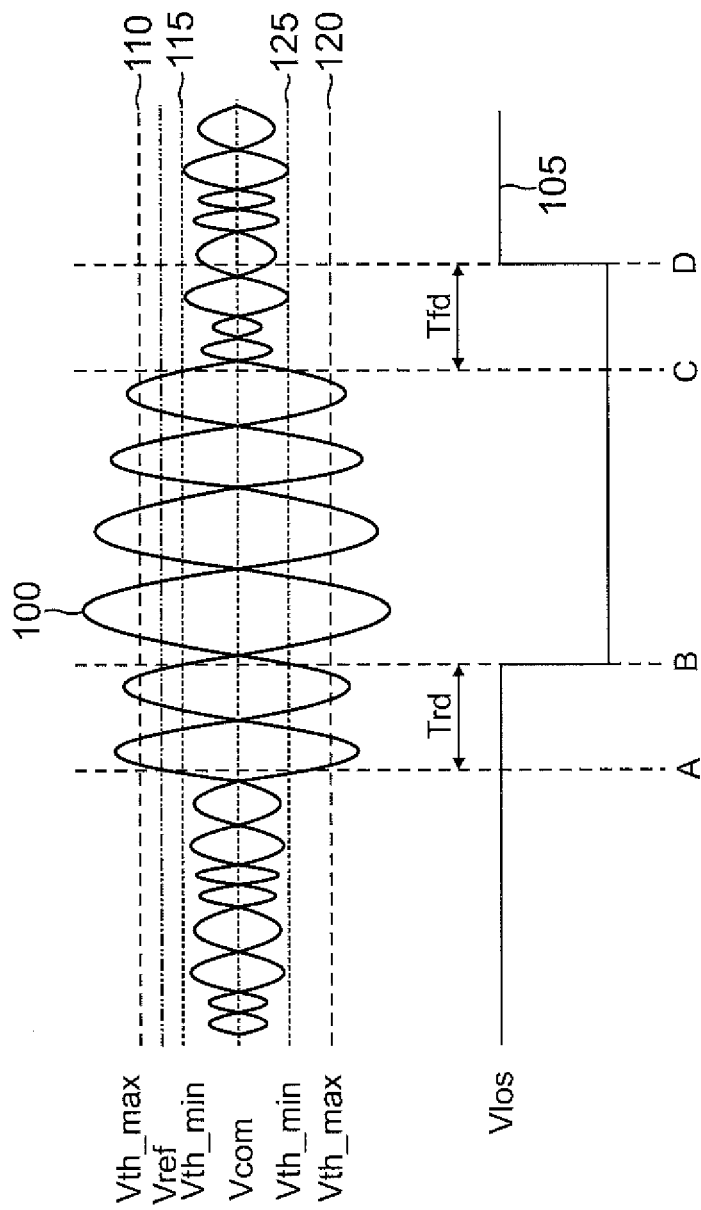
FIG. 1 illustrates a received signal as compared to loss-of-signal thresholds in a loss-of-signal detector employing hysteresis in accordance with an embodiment of the disclosure.

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

In a high-speed serial link, the amplitude of the received signal may be decreased because of medium or channel loss. The reduced amplitude of the received signal in turn reduces the vertical opening of the data eye at the input of the receiver. With the data eye collapsed, the receiver cannot recover the clock such that the received data will not be error free. The channel noise and crosstalk also degrade the signal further because of the resulting low SNR.

The loss-of-signal detector architectures disclosed herein enable the receiver to operate when the incoming signal has sufficient amplitude to guarantee successful data recovery. The detection of sufficient amplitude is advantageous as certain serial link protocols use data bursts separated by predefined time intervals as handshaking to establish the link between the transmitter and receiver. The handshaking is a logic operation that needs to identify when a signal is lost at the receiver.

The loss-of-signal detectors disclosed herein thus quantify the amplitude of the incoming differential data signal to enable these advantageous features by comparing the received signal amplitude to a known reference voltage Vref. The reference voltage Vref is generated responsive to a common mode voltage Vcom. In this fashion, variations in the common mode voltage Vcom are reflected in the reference voltage Vref. The comparison of the received differential signal amplitude to the reference voltage Vref as practiced by the loss-of-signal detector disclosed herein is thus robust to variations in power supply voltage, temperature, and process variations.

The comparison of the received signal amplitude to the reference voltage Vref may include hysteresis to avoid undesirable glitches in loss-of-signal detection as could result from noise or circuit delays. Hysteresis involves two signal amplitude thresholds: a minimum amplitude threshold Vth_min and a maximum amplitude threshold Vth_max. If the received signal's amplitude is above the maximum threshold Vth_max, the received signal is deemed to be detected. Conversely, if the received signal's amplitude is below the minimum threshold Vth_min, the signal is deemed to be lost. The hysteresis can be implemented by a comparator or by a suitable logic circuit. The minimum and maximum thresholds may be programmably based upon the reference voltage Vref.

Because high-speed serial links use a differential input signal, the minimum and maximum amplitude thresholds have positive and negative counterparts for application to the positive and negative received signal amplitudes, respectively. Turning now to the drawings, FIG. 1 illustrates the application of the Vth_max and Vth_min thresholds to a received differential input signal 100. A positive Vth_max 110 and Vth_min 115 apply to the positive cycles of signal 100 above a common mode voltage Vcom. Similarly, a negative Vth_max 120 and Vth_min 125 apply to the negative cycles of signal below Vcom. A loss-of-signal voltage (Vlos) is initially high since signal 100 is within the window between positive Vth_min 115 and negative Vth_min 125 prior to the start of a valid input signal transmission. At time point A, signal 100 has positive peaks and negative peaks outside of the window between positive Vth_max 110 and negative Vth_max 120 such that signal may be deemed to be detected. This detection requires a certain amount of time denoted as Trd. Vlos 105 is thus de-asserted at a time point B equaling A plus Trd. At a time point C, signal 100 again falls within the window between positive Vth_min 115 and negative Vth_min 125 such that signal 100 may be deemed to be lost by the loss-of-signal detector disclosed herein. This loss-of-signal detection requires a certain amount of time denoted as Tfd. Vlos 105 is thus asserted at a time point D equaling C plus Tfd.

The common mode voltage Vcom will have variations in amplitude due to system imperfections. The disclosed signal detector is robust to such common mode voltage variations because it generates Vref such that it tracks Vcom without losing the reference voltage DC level. The disclosed loss-of-signal detector sums Vref with Vcom such that Vref tracks the common mode voltage variation. In this fashion, the disclosed signal detector compares the received signal amplitude plus the common mode voltage to a sum of the reference voltage and the common mode voltage.

Figure 2:
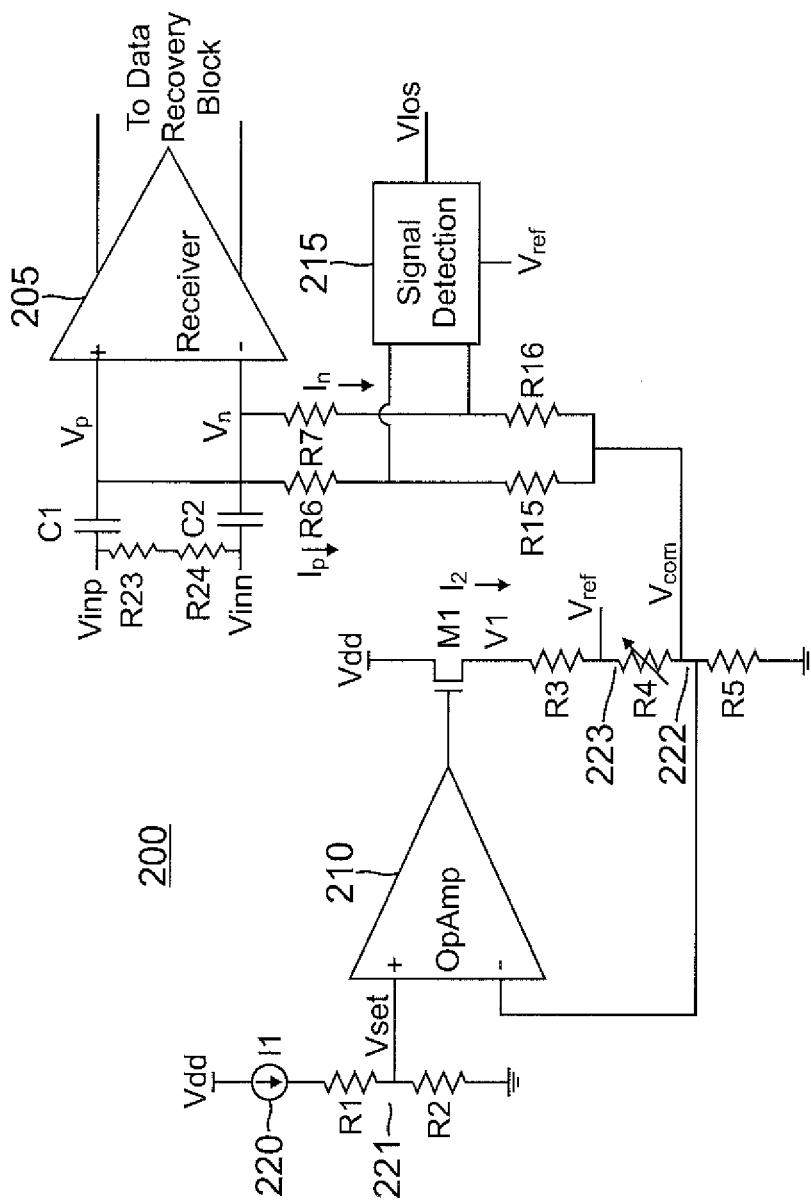
FIG. 2 is a diagram for a loss-of-signal detector in accordance with an embodiment of the disclosure.

FIG. 2 illustrates a loss-of-signal detector 200 in accordance with an embodiment of the disclosure. A differential input signal is received as a positive voltage input voltage (Vinp) and a negative input voltage (Vinn) with regard to input resistors R23 and R24. To remove any DC offset, Vinp and Vinn are filtered through capacitors C1 and C2, respectively, to provide filtered differential input voltage signals Vp and Vn. A receiver 205 processes the filtered differential input voltages to drive a data recovery block (not illustrated) as is known in the high-speed differential signaling arts. But receiver 205 requires a certain amount of DC bias for proper operation. Thus, filtered differential input voltage signals Vp and Vn have a DC offset equaling a common mode voltage Vcom. The filtered differential input voltage signal Vp is isolated from the common mode voltage Vcom by resistors R6 and R15. Similarly, the filtered differential input voltage signal Vn is isolated from the common mode voltage by resistors R7 and R16.

A differential amplifier 210 produces the common mode voltage Vcom at its negative input terminal with regard to a set voltage Vset driving its positive input terminal. A current source 220 drives a current I1 through a resistor R1 in series with a resistor R2 to produce voltage Vset at a node 221 between resistors R1 and R2. Differential amplifier 210 drives a gate of an NMOS transistor M1 responsive to amplifying a difference between Vset and Vcom. The drain of transistor M1 couples to a power supply voltage Vdd and its source couples to a resistor R3, which is in series with a variable resistor R4 and a resistor R5. A terminal of resistor R5 couples to ground whereas Vcom is produced at a node 222 between variable resistor R4 and resistor R5. Similarly, a reference voltage Vref is produced at a node 223 between resistor R3 and variable resistor R4.

Differential amplifier 210 controls a gate voltage of transistor M1 so as to control a current I2 driven through series-coupled resistors R3, variable resistor R4, and resistor R5. Through Ohm's law, the common mode voltage Vcom is thus I2*R5. Similarly, the reference voltage Vref equals I2*(R5+R4). Thus, if I2 varies up or down, Vref and Vcom will vary up and down accordingly. In this fashion, process variations, power supply voltage variations, or temperature variations affect Vref and Vcom equally so that these variations do not affect the loss-of-signal detection performance for detector 200.

Variable resistor R4 enables the tuning of Vref to accommodate different serial protocols. In addition, variable resistor R4 may be tuned to accommodate channel noise and crosstalk characteristics. Referring back to FIG. 1, variable resistor R4 is also tuned so that there is sufficient noise margin in the loss-of-signal detection. An example embodiment for variable resistor R4 is shown in FIG. 3. In this embodiment, R4 has eight steps of resistance resolution selected through eight switches ranging from a switch S0 to a switch S7. Seven resistors are arranged with regard to the switches such that one resistor couples between corresponding pairs of the switches. For example, a resistor R8 couples between switch S0 and a switch S1, a resistor R9 couples between switch S1 and a switch S2, and so on such that a resistor R14 couples between a switch S6 and switch S7. If switch S7 is closed with the others open, the reference voltage Vref equals I1*R5. But if a switch S6 is closed with all the other switches open, the reference voltage Vref equals I1*(R5+R14). Conversely, should just switch S0 be closed, the reference voltage Vref equals I1*(R5+R14+R13+R12+R11+R10+R9+R8). In this fashion, by selectively closing one of the switches, the reference voltage Vref may be varied accordingly.

Referring again to FIG. 2, a signal detection module 215 samples the filtered differential input voltages Vp and Vn through resistors R6 and R7, respectively. Resistors R6 and R7 are sufficiently larger than resistors R23 and R24 so as to not load the input to receiver 205. In addition, signal detection module 215 has a relatively small input capacitance to further avoid signal degradation for receiver 205. An embodiment of signal detection module 215 is shown in more detail in FIG. 4. A pre-amplifier 400 amplifies a voltage potential difference between an input node 401 and an input node 402 to provide amplified differential voltages Vp1 and Vn1, respectively. Input node 401 couples between serially-connected resistors R6 and R15 whereas input node 402 couples between serially-connected resistors R7 and R16. A stage 1 set of comparators 405 compares the amplified differential voltages Vp1 and Vn1 to the reference voltage Vref to produce a first signal detection voltage Vsd1. A peak detection module 410 processes the first signal detection voltage Vsd1 to produce a second signal detection voltage Vsd2. Either the first signal detection voltage VSd1 or the second signal detection voltage Vsd2 may selected by a multiplexer 415 to produce a final voltage signal Vsd. Loss-of-signal voltage Vlos 105 may then be produced by an inverter 420 that inverts final voltage signal Vsd.

Figure 5:
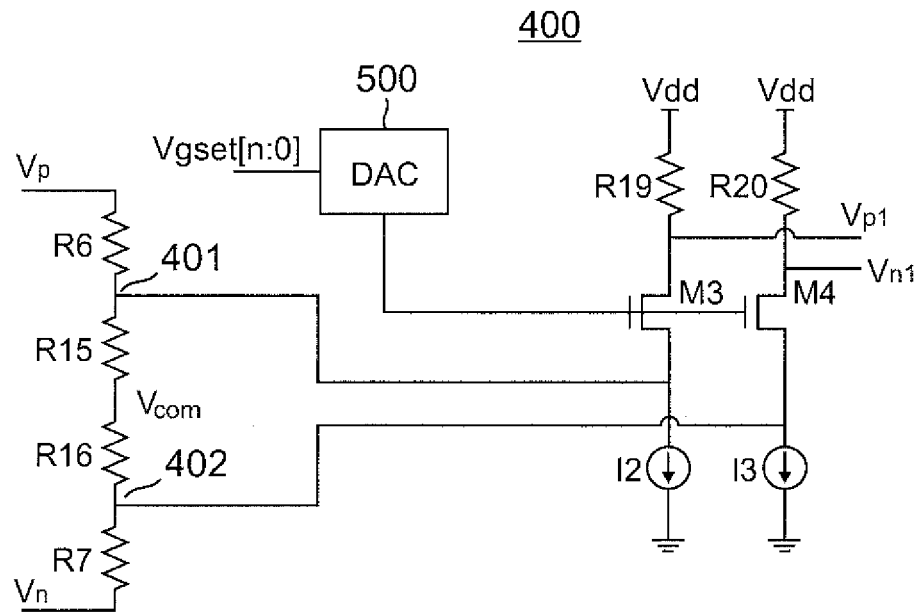
FIG. 5 is a schematic diagram for the pre-amplifier in the signal detection module of FIG. 4.

An example pre-amplifier 400 is shown in FIG. 5. A digital-to-analog converter (DAC) 500 receives a digital setting voltage Vgset and drives the gates of a pair of NMOS transistors M3 and M4 accordingly with an analog version of Vgset. Such a common-gate configuration for pre-amplifier 400 provides a low impedance to the differential input voltages on nodes 401 and 402 to preserve a return loss for receiver 205. The drain of M3 couples to the power supply Vdd though a resistor R19. Similarly, the drain of M4 couples to Vdd through a resistor R20. Amplified differential voltage Vp1 equals the drain voltage for M3 whereas amplified differential voltage Vn1 equals the drain voltage for M4. The source of M3 couples through a current source I2 to ground. Similarly, the source of M4 couples through a current source I3 to ground. Input node 401 also couples to the source of M3 whereas input node 402 couples to the source of M4.

Figure 6:
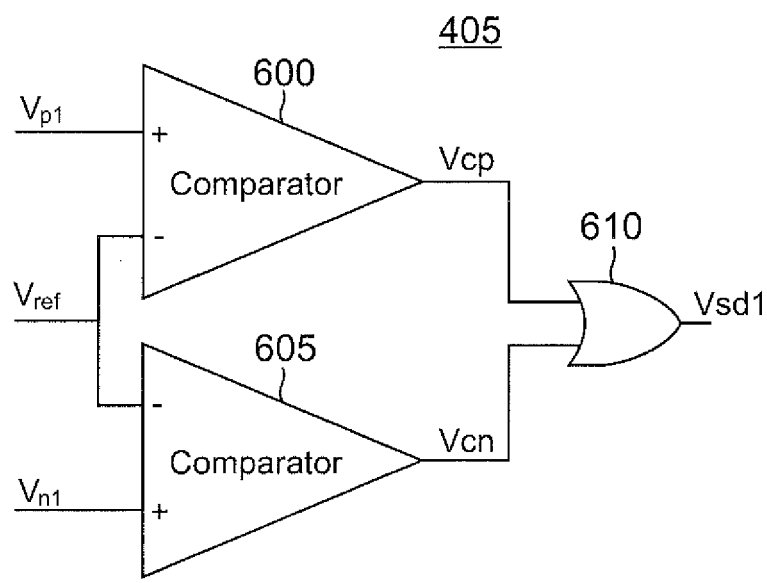
FIG. 6 is a diagram for the stage 1 comparators in the signal detection module of FIG. 4.
Figure 7:
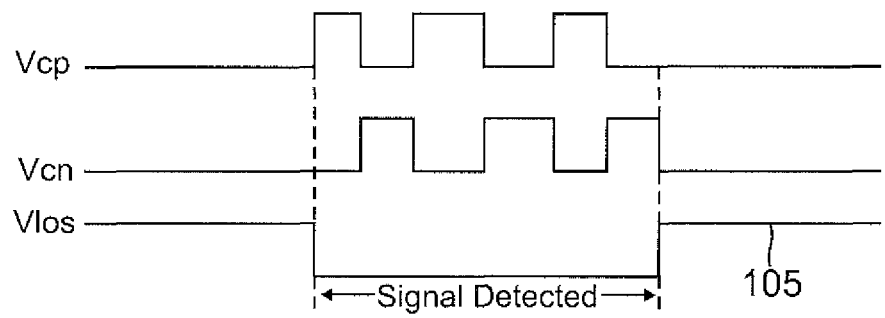
FIG. 7 illustrates the waveforms for the stage 1 comparator output signals.

Example first stage comparators 405 are shown in FIG. 6. A comparator 600 compares amplified differential voltage Vp1 to the reference voltage Vref to produce a first comparison voltage Vcp. Similarly, a comparator 605 compares amplified differential voltage Vn1 to the reference voltage Vref to produce a second comparison voltage Vcn. An OR gate 610 functions to drive first signal detection voltage Vsd1 based upon a logical OR of first and second comparison voltages Vcn and Vcp. Because of the gain provided by pre-amplifier 400, first and second comparison voltages are effectively complementary digital signals as shown in FIG. 7 during a period of valid signal detection. Since either Vcn or Vcp equals Vdd at this time, first signal detection voltage Vsd1 equals Vdd while a valid signal is detected. Since Vlos 105 is the complement of Vsd1 in this embodiment, Vlos 105 goes low during the valid signal detection period. However, when the input differential signal is lost, Vlos 105 goes high. Referring back to FIG. 1, hysteresis depends upon the behavior of comparators 600 and 605. In some embodiments, they may be designed to have no hysteresis whereas in other embodiments they may have hysteresis. Alternatively, a logic circuit (not illustrated) may be used to provide hysteresis.

Figure 8:
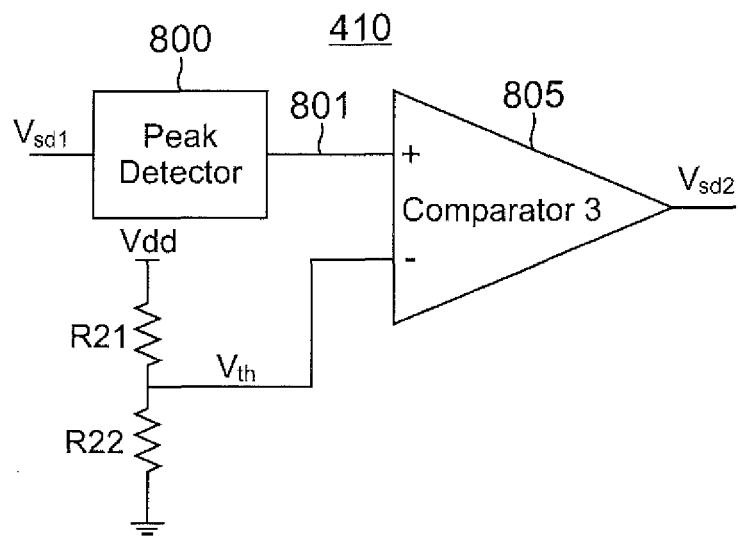
FIG. 8 is a diagram of the peak detection and comparator circuit in the signal detection module of FIG. 4.

An example peak detection module 410 is shown in FIG. 8. A peak detector circuit 800 peak detects first signal detection voltage Vsd1 to produce a peak-detected signal 801. A comparator 805 compares peak-detected signal 801 to a threshold voltage Vth provided by a voltage divider formed by resistors R21 and R22. Peak detector circuit 800 has an internal capacitance such that it acts as an integrator over relatively short periods as is known in the peak detection arts. Thus, if first signal detection voltage Vsd1 goes high momentarily due to a glitch, peak-detected signal 801 will not exceed the threshold voltage Vth. On the other hand, peak-detected signal 801 will exceed this threshold voltage should first signal detection voltage Vsd1 remain high for a sufficient amount of time. In this fashion, second signal detection voltage Vsd2 is immune to glitches in first signal detection voltage Vsd1 so to eliminate the channel effects and noise on input signals with short bit length. Since a user may want to know if glitches are occurring, multiplexer 415 (FIG. 4) provides the flexibility to select between first and second signal detection voltages Vsd1 and Vsd2 to produce Vlos 105. In that regard, Vsd1 may also be denoted as Vlos1 and Vsd2 may be denoted as Vlos2. Because first signal detection voltage Vsd1 is a high-swing digital signal, the design requirements for peak detector circuit 800 and comparators 805 are relaxed such that they are insensitive to voltage level, noise, leakage, and process variations.

Referring again to FIG. 2, consider the advantages of loss-of-signal detector 200. Any variation in the common mode voltage Vcom will be mirrored by a corresponding variation in the reference voltage Vref. Since the inputs to pre-amplifier 400 depend upon the common mode voltage Vcom, the comparison by stage 1 comparators 405 (e.g., comparators 600 and 605) to the reference voltage Vref eliminates any dependency on the common mode voltage Vcom.

It will be appreciated that the techniques and concepts discussed herein are not limited to the specific disclosed embodiments. For example, the input capacitors C1 and C2 are optional. Thus, alternative embodiments would detect a loss-of-signal for a DC-coupled differential input signal. The appended claims encompass all such changes and modifications as fall within the true spirit and scope of this invention.

We claim:

1. A circuit, comprising:
   a loss-of-signal detector configured to compare a pair of differential input voltages having a common mode voltage to a reference voltage that depends upon the common mode voltage; and
   a differential amplifier configured to control a current through a variable resistor to produce the reference voltage at a first terminal of the variable resistor and to produce the common mode voltage at an opposing second terminal of the variable resistor,
   wherein the loss-of-signal detector includes:
      a pre-amplifier configured to amplify the differential input voltages into amplified differential input voltages;
      a first comparator configured to compare a first one of the amplified differential voltages to the reference voltage to provide a first compared voltage;
      a second comparator configured to compare a second one of the amplified differential voltages to the reference voltage to provide a second compared voltage; and
      an OR gate configured to logically OR the first and second compared voltages to provide a first loss-of-signal voltage (Vlos1).

2. The circuit of claim 1, wherein the loss-of-signal detector further includes a peak detector circuit configured to detect a peak in Vlos1 to provide a peak-detected signal, and wherein the loss-of-signal detector further includes a third comparator configured to compare the peak-detected signal to a threshold voltage to provide a second loss-of-signal voltage (Vlos2).

3. The circuit of claim 2, wherein the loss-of-signal detector further includes a multiplexer configured to select between Vlos1 and Vlos2 to provide a multiplexer output signal, and wherein the loss-of-signal detector further includes an inverter configured to invert the multiplexer output signal into a final loss-of-signal voltage (Vlos).

4. A circuit, comprising:
a loss-of-signal detector configured to compare a pair of differential input voltages having a common mode voltage to a reference voltage that depends upon the common mode voltage;
a differential amplifier configured to control a current through a variable resistor to produce the reference voltage at a first terminal of the variable resistor and to produce the common mode voltage at an opposing second terminal of the variable resistor; and
a differential input receiver configured to receive a differential input signal received at a pair of first resistors, and a pair of capacitors coupled to the pair of first resistors and configured to provide the differential input voltages, and wherein the loss-of-signal detector is configured to receive the differential input voltages through a pair of second resistors, the second resistors having a resistance that is larger than a resistance for the first resistors.

5. The circuit of claim 1, wherein the pre-amplifier is a common-gate amplifier.

6. The circuit of claim 5, wherein the common-gate amplifier includes a pair of current sources.

7. The circuit of claim 1, wherein the differential amplifier is configured to control the current by driving a gate of a transistor.

8. The circuit of claim 2, wherein the peak detector includes an integrating circuit.

9. A method, comprising:
driving a current through a series of resistors to produce a reference voltage and a first common mode voltage;
deriving a pair of first differential input voltages from a received differential input signal such that a common mode voltage for the pair of first differential input voltages is the first common mode voltage;
comparing the pair of first differential input voltages to the reference voltage to produce a loss-of-signal voltage (Vlos);
receiving the differential input signal through a pair of first resistors to produce a pair of second differential input voltages; and
blocking a DC-voltage in the pair of second differential input voltages to produce a pair of third differential input voltages,
wherein the deriving the pair of first differential input voltages comprises receiving the pair of third differential input voltages through a pair of second resistor.

10. The method of claim 9, wherein comparing the pair of first differential input voltages comprises amplifying the pair of first differential input voltages into a pair of amplified differential input voltages and comparing each of the amplified differential input voltages to the reference voltage to produce a first signal detection voltage.

11. The method of claim 10, further comprising peak detecting the first signal detection voltage to produce a peak-detected signal and comparing the peak-detected signal to produce a second signal detection voltage.

12. The method of claim 11, further comprising selecting between the first and second signal detection voltages to produce a selected signal and inverting the selected signal to produce Vlos.

13. The circuit of claim 4, wherein the loss-of-signal detector comprises a peak detector circuit configured to detect a peak in Vlos1 to provide a peak-detected signal, and wherein the loss-of-signal detector further includes a third comparator configured to compare the peak-detected signal to a threshold voltage to provide a second loss-of-signal voltage (Vlos2).

14. The circuit of claim 4, wherein the loss-of-signal detector comprises a multiplexer configured to select between Vlos1 and Vlos2 to provide a multiplexer output signal, and wherein the loss-of-signal detector further includes an inverter configured to invert the multiplexer output signal into a final loss-of-signal voltage (Vlos).

* * * * *